(12) United States Patent
Luu

(10) Patent No.: US 6,459,336 B1
(45) Date of Patent: Oct. 1, 2002

(54) RF AMPLIFIER SYSTEM HAVING PDM DRIVE

(75) Inventor: Ky Thoai Luu, Mason, OH (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/689,244

(22) Filed: Oct. 11, 2000

(51) Int. Cl.[7] .................................................. H03F 3/38
(52) U.S. Cl. ...................................... 330/10; 330/207 A
(58) Field of Search ............................... 330/10, 207 A, 330/251; 327/423, 424; 318/811

(56) References Cited

U.S. PATENT DOCUMENTS

| | | | |
|---|---|---|---|
| 3,253,228 A | * | 5/1966 | Montner ...................... 330/10 |
| 3,506,920 A | | 4/1970 | Swanson |
| 4,164,714 A | | 8/1979 | Swanson |
| 5,729,175 A | * | 3/1998 | Ferrer ......................... 330/10 |
| 6,229,388 B1 | * | 5/2001 | Nalbant ....................... 330/10 |
| 6,285,255 B1 | * | 9/2001 | Luu et al. .................... 330/149 |
| 6,294,957 B1 | * | 9/2001 | Luu ............................. 330/251 |

* cited by examiner

*Primary Examiner*—Benny Lee
*Assistant Examiner*—Henry Choe
(74) *Attorney, Agent, or Firm*—Tarolli, Sundheim, Covell, Tummino & Szabo L.L.P.

(57) ABSTRACT

An RF amplifier system comprising a plurality of actuatable switches, each switch being normally OFF and being actuated to an ON condition by a received turn ON pulse and remains ON for the duration of the turn ON pulse. The switches are connected in a series circuit with a load across a DC voltage source. An RF source provides a train of RF pulses exhibiting a fixed frequency and fixed duty-cycle and wherein each RF pulse is of a fixed magnitude and duration. A control circuit receives the RF pulses and provides therefrom the turn ON pulses which are of equal duration and which are synchronized to the RF pulses. The control circuit simultaneously applies the turn ON pulses to the plurality of transistor switches. The control circuit includes a pulse duration modulator that varies the duration of the turn ON pulses.

11 Claims, 2 Drawing Sheets

RF AMPLIFIER SYSTEM HAVING PDM DRIVE

TECHNICAL FILED

The present invention is directed to an RF amplifier system and, more particularly, to such a system employing pulse duration modulation (PDM) drive for actuating transistor switches.

BACKGROUND OF THE INVENTION

It is frequently desirable that transistor switches, such as MOSFET transistor switches, be connected in a series circuit for purposes of connecting a high voltage source, such as 50 kV across a load at a radio frequency, such as in a range from 100 KHz to 2 MHz. An example is a carrier wave within this frequency range, such as at 1 MHz, and having a frequency band on the order of 20 KHz to accommodate audio frequency signals from approximately 0 to 20 KHz.

In the case of MOSFETs, the voltage breakdown of each MOSFET is on the order of 500 V. If one hundred MOSFETs are connected together in series, the total circuit withstanding voltage is on the order of 50 kV.

The need arises as to how to control the various MOSFETs. Pulse duration modulation (PDM) has been employed in RF amplifiers in the past. Examples are found in the U.S. patents to H. I. Swanson U.S. Pat. Nos. 3,506,920 and 4,164,714. However, these patents do not disclose PDM control of a plurality of series connected switching transistors for connecting a voltage source across a load at a high frequency.

SUMMARY OF THE INVENTION

In accordance with the invention, an RF amplifier system includes a plurality of actuatable switches each switch being normally OFF and being actuated to an ON condition by a received turn ON pulse and then remains ON for the duration of the turn ON pulse. The switches are connected in a series circuit with a load across a DC voltage source. An RF source provides a train of RF pulses exhibiting a fixed frequency and fixed duty-cycle and wherein each RF pulse is of a fixed magnitude and duration. A control circuit receives the RF pulses and provides therefrom the turn ON pulses which are of equal duration and which are synchronized to the RF pulses. The control circuit simultaneously applies the turn ON pulses to the plurality of transistor switches. The control circuit includes a pulse duration modulator that varies the duration of the turn ON pulses.

In accordance with a more limited aspect of the present invention, the train of RF pulses is a first train of first RF pulses and the modulator includes a phase shifter that receives the first RF pulses and provides therefrom a second train of second RF pulses identical to the first train of RF pulses but phase shifted therefrom.

In accordance with a still further aspect of the present invention, the system includes a pulse magnitude adjuster that adjusts the relative magnitude between the first and second trains of RF pulses so that the first RF pulses are of a different magnitude than the second RF pulses.

In accordance with a still further aspect of the present invention, the system includes a pulse combiner that combines the first and second RF pulses to provide the turn ON pulses each having a duration dependent upon the phase relationship between the first and second pulse trains.

BRIEF DESCRIPTION OF THE DRAWINGS

The foregoing and other objects and advantages of the present invention will become more readily apparent from the following description of the preferred embodiments, as taken in conjunction with the accompanying drawings, which are a part hereof, and wherein.

DESCRIPTION OF A PREFERRED EMBODIMENT

Figure 1:
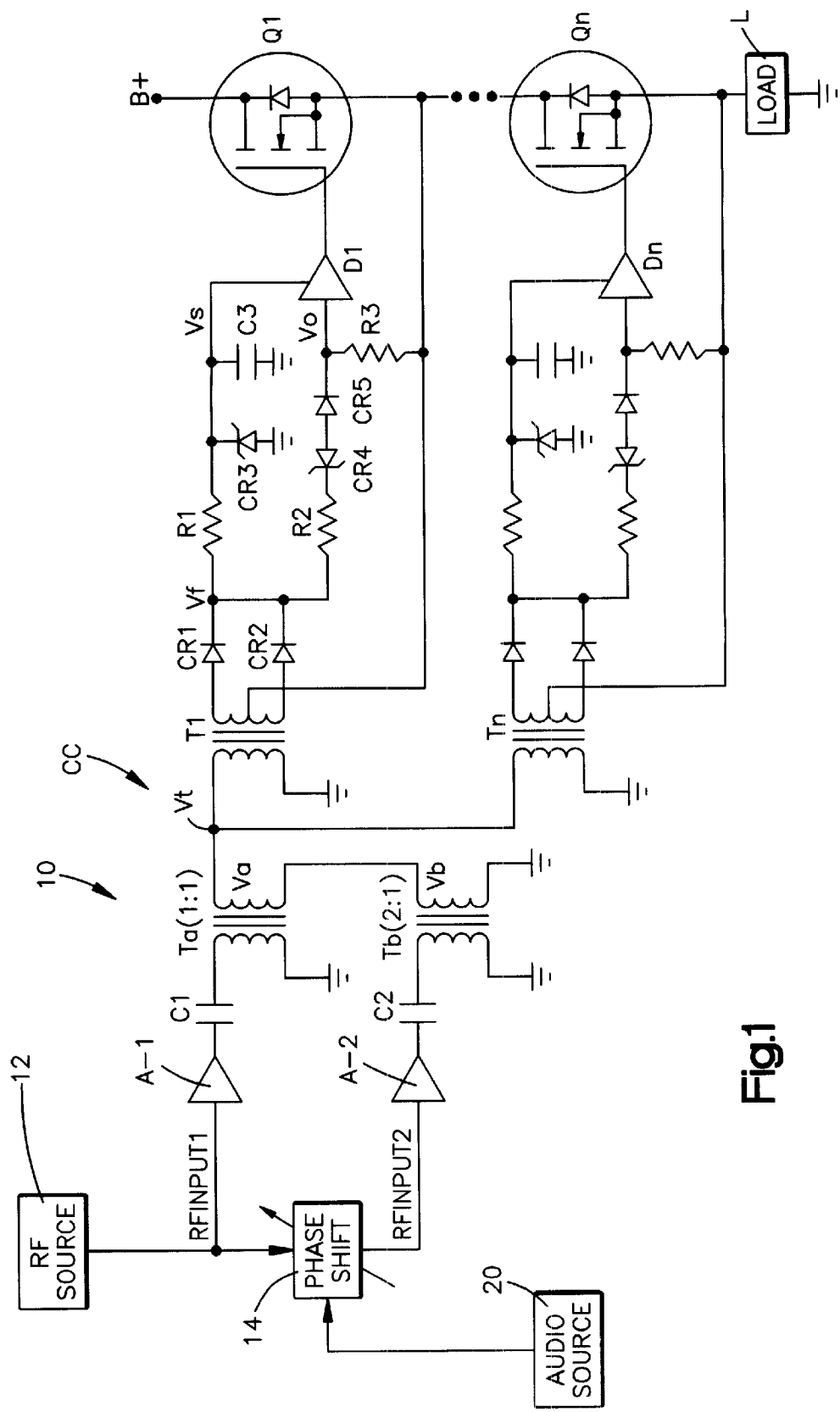
FIG. 1 is a schematic-block diagram illustration of one embodiment of the present invention; and, FIG. 2 is an illustration of waveforms of voltage with respect to time showing the operation of the invention herein.

Reference is now made to FIG. 1 which illustrates a preferred embodiment of the present invention. An amplifier system 10 of FIG. 1 includes a plurality of transistor switches Q1 through QN. The transistor switches are preferably MOSFET transistors. These transistor switches are connected together in series with a load L across a DC voltage source B+, such as 50 kV. The MOSFET transistors Q1 through QN are normally OFF and are each actuated to an ON condition by a received turn ON pulse and then remain ON for the duration of the turn ON pulse. If the voltage breakdown of a MOSFET transistor is 500 V and the circuit employs 100 MOSFETs in series, the total circuit withstanding voltage is 100 times 500 or 50 kV. In the example herein, when all of the transistor switches Q1 through QN are turned ON, 50 kV is applied across load L. Source 12 provides a train of RF pulses that exhibit a fixed frequency and fixed duty-cycle. Each RF pulse is of a fixed magnitude and duration. The frequency of the pulses is in the range from approximately 100 KHz to approximately 2 KHz. The bandwidth may be approximately 20 KHz to accommodate audio signals having a frequency range from 0 to approximately 20 KHz.

The control circuit CC of FIG. 1 receives the RF pulses from the RF source 12 and provides therefrom turn ON pulses which are simultaneously applied to all of the transistor switches Q1 through QN in order to apply a B+ voltage across the load L at a high switching frequency. The turn ON pulses are of equal duration and are synchronized to the RF pulses. The turn ON pulses are pulse duration modulated by a pulse duration modulator that varies the duration of the turn ON pulses as will be described below.

The train of RF pulses obtained from the RF source 12 can be referred to as a first train of first RF pulses. These pulses are amplified by an amplifier A-1 and thence applied through a capacitor C1 to drive a transformer $T_a$ having a primary to secondary winding ratio of 1:1. The secondary voltage has a magnitude $V_a$.

The train of RF pulses from source 12 are also supplied to a phase shift circuit 14 that provides a second train of second RF pulses that are identical to the first train of first RF pulses but phase shifted therefrom. The phase shifter is adjustable to adjust the phase of the second train of RF pulses relative to that of the first train of RF pulses. The second train of RF pulses is applied to an amplifier A-2 that drives a transformer $T_b$ by way of a capacitor C2. The transformer $T_b$ has a primary to secondary winding ratio of 2:1 with the secondary voltage $V_b$ equal to one-half that secondary voltage $V_a$. These secondary voltages are combined to provide a voltage $V_t$.

Figure 2:
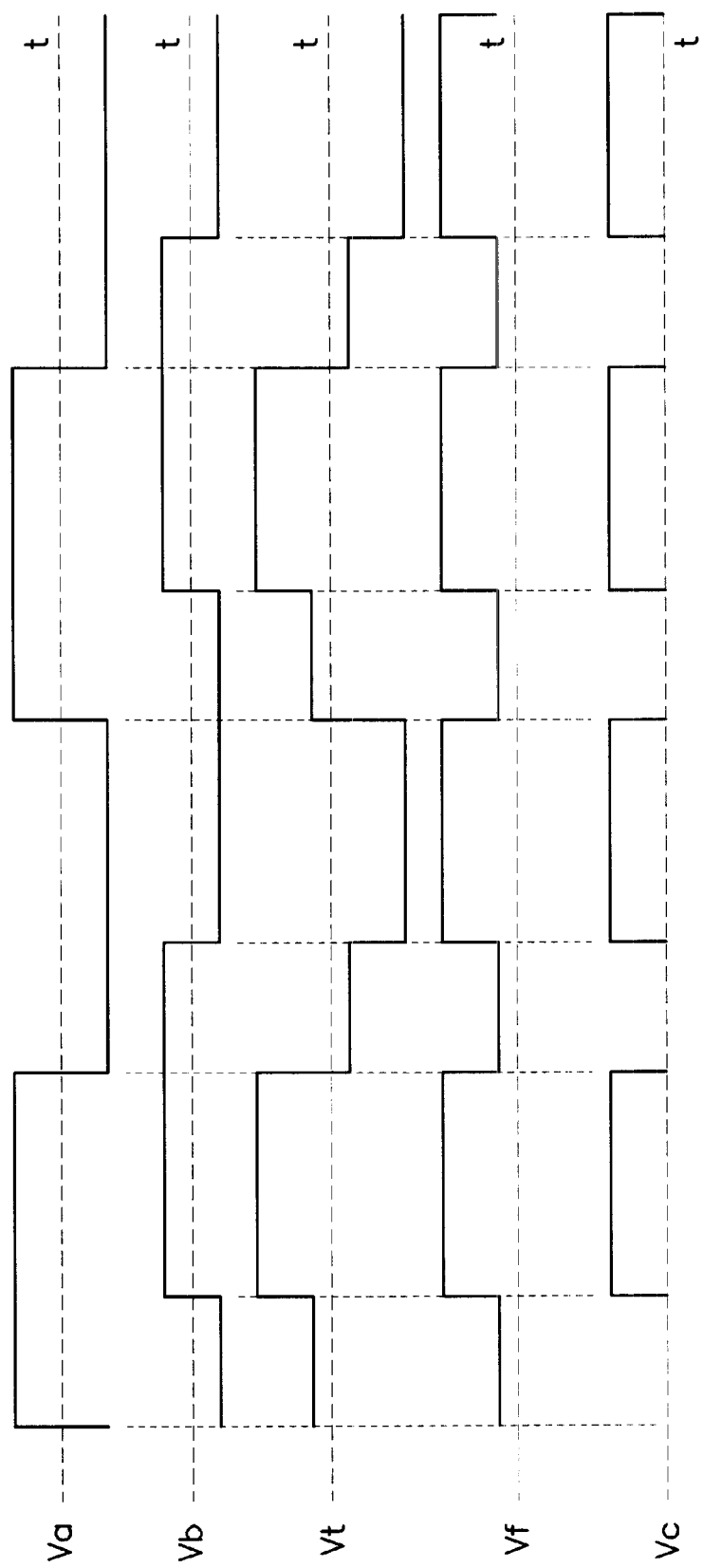

Reference should now be made to FIG. 2 which illustrates the waveforms of voltages $V_a$ and $V_b$ which are phase shifted from each other and wherein the magnitude of voltage $V_b$ is one-half that of voltage $V_a$. The voltage pulses are combined to obtain voltage pulses $V_t$, the resulting waveform appears as is shown in FIG. 2. This composite signal is then supplied to the primary windings of transformers T1 through TN. These transformers are identical and provide complete isolation between the primary circuit and the secondary circuits. This isolation is provided because the secondary voltage has a much higher potential than the primary voltage . Good bandwidth is an important factor for good resolution and control. Magnetically coupled transformers T1 through TN provide these functions since the windings can be easily separated and still provide good bandwidth.

Diodes CR1 and CR2 are used in conjunction with a secondary center-tapped transformer to form a full wave rectified circuit. This circuit rectifies the AC signal to obtain the modulated DC composite signal $V_f$ which takes the form of the waveform $V_f$ in FIG. 2. fit will be noted that the voltage level of signal $V_f$ is positive and in two steps. The lower step is of a magnitude corresponding with that of voltage $V_b$ and the upper step is of a magnitude corresponding with $V_a+V_b$. The voltage signal $V_f$ is a modulated DC composite signal which is used to power the MOSFET driver D1 through a simple shunt DC regulator formed by resistor R1 Zener diode CR3, and capacitor C3 to provide operating voltage VS for the driver D1.

The PDM control signal $V_c$ is parallel extracted from the voltage $V_f$ through a series Zener diode network including resistor R2, Zener diode CR4, diode CR5, and resistor R3. The network subtracts the lower portion of the voltage $V_f$ (see FIG. 2) to obtain the signal as indicated by the waveform of the control signal $V_c$. It is to be noted that the control signal $V_c$ is of an amplitude corresponding with the positive amplitude of the voltage $V_a$. The control signal $V_c$ is made up of a train of pulses that are synchronized with the RF input signal ($V_a$ or $V_b$). The control signal $V_c$ is a pulse-modulated control signal which is supplied to driver D1 so that the MOSFET transistor Q1 is turned ON for a time duration corresponding with the pulse signal $V_c$. The control signal is pulse-width modulated by phase shifting the second RF pulse train (voltage pulses $V_b$) by the adjustable phase shifter 14. The phase shifter is adjustable by a time varying signal applied thereto. In the application being presented herein, the time varying signal is an audio signal obtained from the audio source 20. As the magnitude of the audio signal increases the phase shift provided by the phase shifter 14 decreases. Thus, the voltage pulses $V_b$ are shifted back and forth in time domain with a phase shift in accordance with the magnitude of the audio signal applied to the phase shifter 14.

The PDM control signal $V_c$ is at a maximum (100 percent duty-cycle) when voltage s $V_a$ and $V_b$ are completely in phase. The control signal $V_c$ is at its minimum (zero percent) when voltages $V_a$ and $V_b$ are completely out of phase.

The MOSFET transistor switches are switched ON when control signal $V_c$ is HIGH and are switched OFF when the control signal $V_c$ is LOW. The control signal $V_c$ is buffered by the MOSFET driver D1 and drives the associated MOSFET transistor Q1.

From the foregoing is seen that the control circuit CC applies turn ON signals ($V_c$ is HIGH) simultaneously to all of the MOSFET transistors Q1 through QN. All the MOSFET transistor switches are turned ON at the same time and are turned OFF at the same time. The turn ON duration is in accordance with the duration of the PDM control signal $V_c$ and this turn ON duration is dependent upon the phase shift between voltage s $V_a$ and $V_b$.

It is noted that the foregoing description has been with respect to the issue of the control circuit drives for transistor Q1. It should be understand that all N control circuits for driving N MOSFET transistors Q1 through QN are constructed in the same manner and no further description is needed herein.

Although the invention has been described in conjunction with a preferred embodiment, it is to be appreciated that various modifications may be made without departing from the spirit and scope of the invention as defined by the appended claims.

Having described the invention, the following is claimed:

1. An RF amplifier system comprising:
   a plurality of N actuatable switches, each switch being normally OFF and being actuated to an ON condition by a received turn ON pulse and remains ON for the duration of said turn ON pulse;
   said switches being connected in a series circuit with a load across a DC voltage source;
   an RF source providing a train of RF pulses exhibiting a fixed frequency and fixed duty-cycle and wherein each RF pulse is of a fixed magnitude and duration; and
   a control circuit that receives said RF pulses and provides therefrom said turn ON pulses which are of equal duration and which are synchronized to said RF pulses and wherein said control circuit simultaneously applies said turn ON pulses to said plurality of transistor switches, said control circuit including a pulse duration modulator that varies the duration of said turn ON pulses;
   wherein said train of RF pulses is a first train of first RF pulses and said modulator includes a phase shifter that receives said first RF pulses and provides therefrom a second train of second RF pulses identical to said first train of first RF pulses but phase shifted therefrom.

2. An RF amplifier system as set forth in claim 1 including a pulse magnitude adjuster that adjusts the relative magnitude between said first and second trains of RF pulses so that said first RF pulses are of a different magnitude than said second RF pulses.

3. An RF amplifier system as set forth in claim 1 including for each said switch a pulse combiner that combines said first and second RF pulses to provide said turn ON pulses each having a duration dependent upon the phase relationship between said first and second RF pulse trains.

4. An RF amplifier system as set forth in claim 2 wherein said pulse magnitude adjuster includes first and second transformers having different transformer winding ratios.

5. An RF amplifier system as set forth in claim 3 wherein each said pulse combiner includes a third transformer.

6. An RF amplifier system as set forth in claim 5 wherein each said third transformer has a secondary winding and a full wave rectifier is connected across said secondary winding.

7. An RF amplifier system as set forth in claim 1 including a signal source providing an amplitude varying signal that varies in amplitude with time, said phase shifter receives said amplitude varying signal and shifts the phase of said second train of RF pulses in dependence upon the magnitude of said amplitude varying signal.

8. An RF amplifier system as set forth in claim 1 wherein said signal source is an audio signal source and wherein said amplitude varying signal is an audio signal.

9. An RF amplifier system as set forth in claim 8 including a pulse magnitude adjuster that adjusts the relative magnitude between said first and second trains of RF pulses so that said first RF pulses are of a different magnitude than said second RF pulses.

10. An RF amplifier system as set forth in claim 9 including for each said switch a pulse combiner that combines said first and second RF pulses to provide said turn ON pulses, each having a duration dependent upon the phase relationship between said first and second RF pulse trains.

11. An RF amplifier system as set forth in claim 9 wherein said pulse magnitude adjuster includes first and second transformers having different transformer winding ratios.

* * * * *

UNITED STATES PATENT AND TRADEMARK OFFICE
CERTIFICATE OF CORRECTION

PATENT NO.   : 6,459,336 B1
DATED        : October 1, 2002
INVENTOR(S)  : Ky Thoai Luu It is certified that error appears in the above-identified patent and that said Letters Patent is hereby corrected as shown below:

Column 4,
Line 40, delete "1" and insert -- 2 --.
Line 60, delete "1" and insert -- 7 --.

Signed and Sealed this

Fourth Day of November, 2003

JAMES E. ROGAN
*Director of the United States Patent and Trademark Office*